United States Patent
Lee et al.

(10) Patent No.: US 9,657,411 B2
(45) Date of Patent: May 23, 2017

(54) SINGLE-CRYSTAL GROWTH APPARATUS

(71) Applicant: LG SILTRON INCORPORATED, Gumi-si, Gyeongsangbuk-do (KR)

(72) Inventors: Chang Youn Lee, Gumi-si (KR); Do Won Song, Gumi-si (KR); Jun Hyuk Choi, Gumi-si (KR); Jin Ho Son, Gumi-si (KR); Cheol Hwan Kim, Gumi-si (KR)

(73) Assignee: LG Siltron Incorporated, Gumi-si, Gyeongsangbuk-do (KR)

( * ) Notice: Subject to any disclaimer, the term of this patent is extended or adjusted under 35 U.S.C. 154(b) by 48 days.

(21) Appl. No.: 14/763,047

(22) PCT Filed: Dec. 19, 2013

(86) PCT No.: PCT/KR2013/011886
§ 371 (c)(1),
(2) Date: Jul. 23, 2015

(87) PCT Pub. No.: WO2014/115969
PCT Pub. Date: Jul. 31, 2014

(65) Prior Publication Data
US 2015/0354092 A1    Dec. 10, 2015

(30) Foreign Application Priority Data

Jan. 23, 2013 (KR) .......... 10-2013-0007353
Dec. 3, 2013 (KR) .......... 10-2013-0148984

(51) Int. Cl.
C30B 35/00    (2006.01)
C30B 15/16    (2006.01)
(Continued)

(52) U.S. Cl.
CPC ............ C30B 35/002 (2013.01); C30B 15/16 (2013.01); C30B 17/00 (2013.01); *C30B 29/20* (2013.01);
(Continued)

(58) Field of Classification Search
CPC combination set(s) only.
See application file for complete search history.

(56) References Cited

U.S. PATENT DOCUMENTS 5,363,795 A    11/1994    Kanada et al.
5,922,127 A    7/1999    Luter et al.
(Continued)

FOREIGN PATENT DOCUMENTS

CN    1468328    1/2004
CN    101548031    9/2009
(Continued)

OTHER PUBLICATIONS

East summary of CN202558965, Nov. 21, 2016.*
(Continued)

*Primary Examiner* — Duy Deo
*Assistant Examiner* — Erin Bergner
(74) *Attorney, Agent, or Firm* — Ked & Associates, LLP

(57) ABSTRACT

Disclosed is a single-crystal growth apparatus including a chamber, a crucible provided in the chamber and configured to accommodate a melt that is a raw material for single-crystal growth, a heater disposed between the crucible and a side wall of the chamber and heating the crucible, and a crucible screen disposed on an upper end of the crucible, and the crucible screen has a bending member reflecting a radiant heat generated from the melt in the crucible to inside wall of the crucible.

16 Claims, 7 Drawing Sheets

(51) Int. Cl.
*C30B 17/00* (2006.01)
*C30B 29/20* (2006.01)

(52) U.S. Cl.
CPC .... *Y10T 117/1024* (2015.01); *Y10T 117/1032* (2015.01)

(56) References Cited

U.S. PATENT DOCUMENTS

| | | | |
|---|---|---|---|
| 6,053,974 A | 4/2000 | Luter et al. | |
| 2002/0134302 A1 | 9/2002 | Ferry et al. | |
| 2012/0118228 A1* | 5/2012 | Lee | C30B 15/14 117/217 |

FOREIGN PATENT DOCUMENTS

| | | | |
|---|---|---|---|
| CN | 102051674 | | 5/2011 |
| CN | 102787351 | | 11/2012 |
| CN | 202558965 | * | 11/2012 ............. C30B 17/00 |
| JP | H01-301581 | | 12/1989 |
| JP | H05-085881 | | 4/1993 |
| JP | H11-189487 | | 7/1999 |
| JP | 2000-211990 A | | 8/2000 |
| JP | 2001-518442 A | | 10/2001 |
| JP | 2004-524256 A | | 8/2004 |
| JP | 2005-053722 A | | 3/2005 |
| KR | 10-2001-0024278 A | | 3/2001 |
| KR | 10-2002-0043986 A | | 6/2002 |
| KR | 10-0831044 B1 | | 5/2008 |
| KR | 10-2009-0008804 A | | 1/2009 |
| KR | 10-0880895 B1 | | 1/2009 |

OTHER PUBLICATIONS

International Search Report dated Mar. 28, 2014 issued in Application No. PCT/KR2013/011886.
European Search Report dated Sep. 20, 2016 issued in Application No. 13872565.0.
Chinese Office Action dated Feb. 4, 2017 issued in Application No. 201380074978.6 (English translation attached).

\* cited by examiner

SINGLE-CRYSTAL GROWTH APPARATUS

CROSS-REFERENCE TO RELATED PATENT APPLICATIONS

This application is a U.S. National Stage Application under 35 U.S.C. §371 of PCT Application No. PCT/KR2013/011886, filed Dec. 19, 2013, which claims priority to Korean Patent Application Nos. 10-12013-0007353, filed Jan. 23, 2013, and 10-2013-0148984, filed Dec. 3, 2013, whose entire disclosures are hereby incorporated by reference.

TECHNICAL FIELD

Embodiments relate to a single-crystal growth apparatus.

BACKGROUND ART

Representative methods for single-crystal growth of sapphire include the Czochralski process, and the Kyropoulos process.

The Kyropoulos process advantageously exhibits lower equipment price and production costs and fewer defects than the Czochralski process. The Kyropoulos process may include filling raw materials in a crucible, heating the raw materials more than melting point of the raw material, forming a seasoning by contacting seed crystal with a melt in the crucible at a temperature for seeding, and forming a body by reducing a power at a constant rate and maintaining a temperature rate for single-crystal growth.

DISCLOSURE

Technical Problem

Embodiments provide a single-crystal growth apparatus, which may prevent a side sticking which is generated when the single crystal is grown transversely.

Technical Solution

In accordance with an embodiment, there is provided a single-crystal growth apparatus including a chamber; a crucible provided in the chamber and configured to accommodate a melt that is a raw material for single-crystal growth; a heater disposed between the crucible and a side wall of the chamber and heating the crucible; and a crucible screen disposed on an upper end of the crucible, wherein the crucible screen has a bending member reflecting a radiant heat generated from the melt in the crucible to inside wall of the crucible.

The bending member may be a bending portion of the crucible screen which is bent in a direction toward the crucible.

The crucible screen may contact the upper end of the crucible and be supported by the upper end of the crucible.

The crucible screen may be round plate type and have a central opening, and the crucible screen may include an outer side part disposed adjacent to an outer circumference surface and supported by the upper end of the crucible; and an inner side part disposed adjacent to an inner peripheral surface and having the bending member.

A lower surface of the inner side part may be inclined toward the crucible with respect to a lower surface of the outer side part.

The inner side part may be bent in a direction toward the crucible with respect to the outer side part.

The inner side part may have the same thickness with the outer side part.

The thickness of the inner side part may decrease from the inner peripheral surface toward the outer circumference surface.

An upper surface of the outer side part and an upper surface of the inner side part may be parallel to each other and be on the same plane.

The single-crystal growth apparatus may further comprise at least one top insulator disposed on the crucible screen, and the at least one top insulator may be a stack of a plurality of layers.

In accordance with another embodiment, there is provided a single-crystal growth apparatus including a chamber; a crucible provided in the chamber and configured to accommodate a melt that is a raw material for single-crystal growth; a reflecting member disposed on an upper end of the crucible and reflecting a radiant heat generated from the melt in the crucible to inside wall of the crucible; and a crucible screen disposed on the reflecting member and reflecting a radiant heat emitted from a surface of the melt into the melt.

The reflecting member may be round plate type and have a central opening.

The reflecting member may include a supporting part supporting the crucible screen; and a bending part bent from the supporting part and reflecting the radiant heat generated from the melt into the inside wall of the crucible.

One end of the supporting part may contact the edge of the lower surface of the crucible screen and the other end of the supporting part may contact the upper end of the crucible.

A length of the bending part may be shorter than a radius length of the crucible screen.

The length of the bending part may be smaller than or equal to a value which is the height of the supporting part divided by cos θ1, and θ1 may be an angle between the bending part and the supporting part.

An upper surface of the bending part may contact a lower surface of the crucible screen and a lower surface of the bending part may be sloped with respect to the upper surface of the bending part.

A thickness of the bending part may increase from a boundary surface between the bending part and the supporting part toward an end of the bending part.

The reflecting member may be formed of a molybdenum.

Advantageous Effects

According to embodiments, it is possible to prevent a side sticking.

DESCRIPTION OF DRAWINGS

The accompanying drawings, which are included to provide a further understanding of the invention, illustrate embodiments of the invention and together with the description serve to explain the principle of the invention.

In the drawings:

FIG. 2b shows a cross section in AB direction of the crucible shown in FIG. 2a;

BEST MODE

Figure 1:
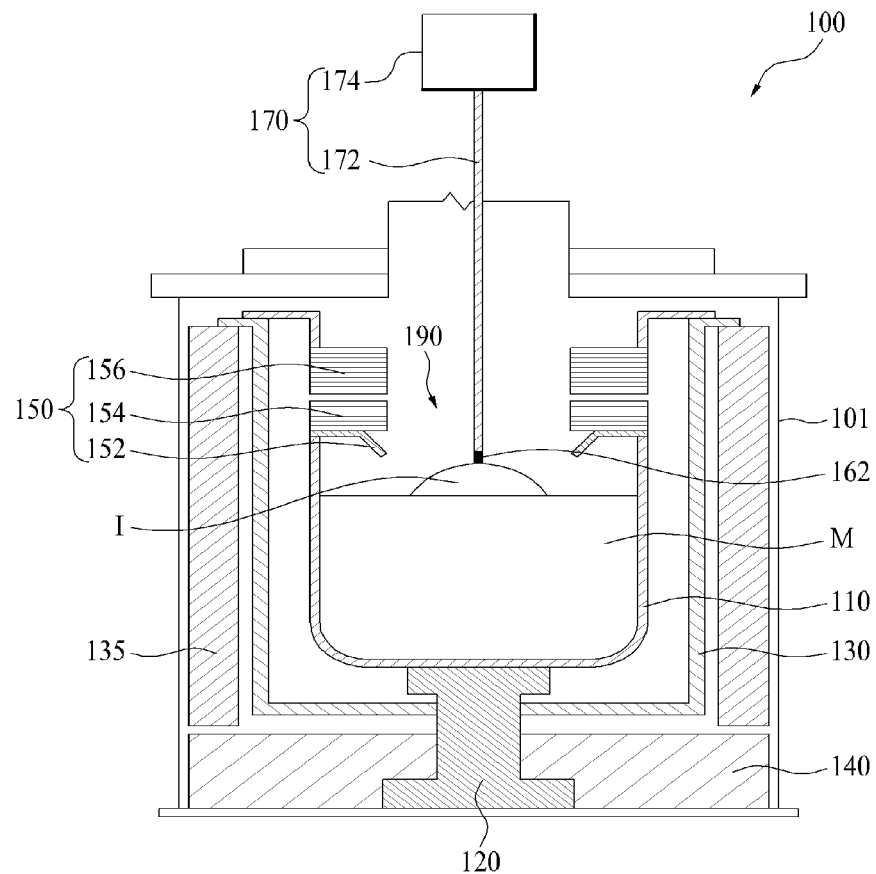
FIG. 1 shows a single-crystal growth apparatus according to an embodiment.

Hereinafter, embodiments will be clearly understood from a description of the accompanying drawings and the embodiments. In the following description of the embodiments, when an element such as a layer (film), region, pattern or structure is referred to as being formed "on" or "under" another element, such as a layer (film), region, pad or pattern, it can be directly "on" or "under" the other element or be indirectly formed with intervening elements therebetween. In addition, it will be understood that "on" or "under" the element may be described relative to the drawings.

In the drawings, the size may be exaggerated, omitted or schematically illustrated for clarity and convenience. In addition, the size of each constituent element does not wholly reflect an actual size thereof. In the drawings, the same or similar elements are denoted by the same reference numerals even though they are depicted in different drawings. Hereinafter, a single-crystal growth apparatus according to the embodiments will be described with reference to the accompanying drawings.

FIG. 1 shows a single-crystal growth apparatus 100 according to an embodiment.

Referring to FIG. 1, the single-crystal growth apparatus 100 includes a chamber 101, a crucible 110, a crucible support base 120, a heater 130, a sidewall insulator 135, a bottom insulator 140, a top insulator 150, and the transfer unit 170.

The chamber 101 may be a space that provides a growth environment to grow a single crystal I.

The crucible 110 may be provided within the chamber 101, to accommodate a raw material melt for growth of the single crystal I. The crucible 110 may be formed of tungsten, but is not limited thereto.

The crucible support base 120 may be located below the crucible 110 to support the crucible 110. The crucible support base 120 may be formed of any material that exhibits excellent thermal conductivity and heat-resistance as well as high resistance to thermal shock and is not easily deformed by heat owing to a low thermal expansion rate thereof. For example, the crucible support base 120 may be formed of molybdenum, but is not limited thereto.

The heater 130 may be provided in the chamber 101 at a constant spacing with an outer circumferential surface of the crucible 110, to heat the crucible 110. The heater 130 may be formed of tungsten, but is not limited thereto.

The heater 130 may be positioned to surround the sidewall and the bottom of the crucible 110, but is not limited thereto. Alternatively, the heater 130 may be located only around the sidewall of the crucible 110. The heater 130 may heat the crucible 110. As the temperature of the crucible 110 is raised via heating of the heater 130, a raw material in the form of a polycrystal lump may be changed into a melt M.

The sidewall insulator 135 may be located around the sidewall of the crucible 110 to prevent heat within the chamber 101 from escaping through the sidewall of the chamber 101. For example, the sidewall insulator 135 may be located between the heater 130 and the sidewall of the chamber 101, to prevent heat of the heater 130 from escaping the chamber 101.

The bottom insulator 140 may be located below the crucible 110 to prevent heat within the chamber 101 from escaping through the bottom of the chamber 101. For example, the bottom insulator 140 may be located between the heater 130 and the bottom of the chamber 101, to prevent heat of the heater 130 from escaping through the bottom of the chamber 101.

The top insulator 150 may be located on the crucible 110, to prevent heat from escaping through the top of the crucible 110.

The transfer unit 170 may support a growing single crystal I and raise or lower the growing single crystal I.

The transfer unit 170 may be located on the crucible 110 and include a seed connector 172 having an end fixed to a seed crystal 162 and a raising and lowering member 174 connecting an end of the seed connector 172 and raising and lowering the seed connector 172. The seed connector 172 may be shaft type.

The top insulator 150 may have an opening 190, which is aligned or corresponding to the growing single crystal I.

Figure 2A:
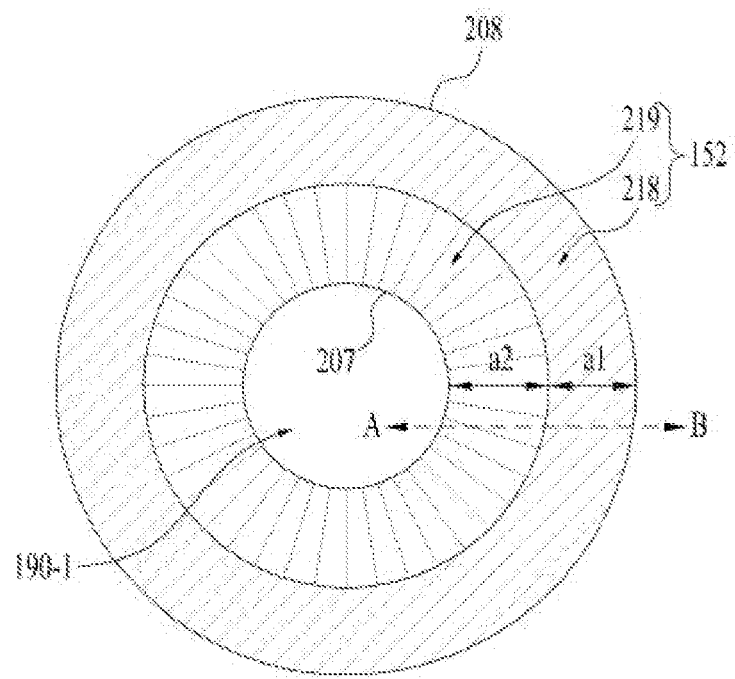
FIG. 2a shows a floor plan of the crucible shown in FIG. 1.
Figure 2B:
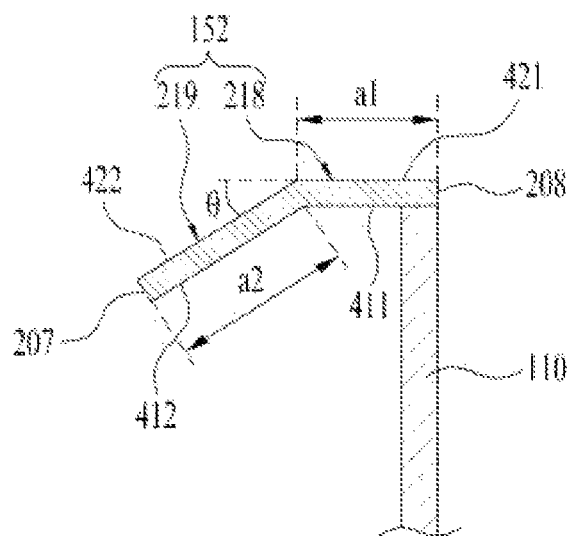

The top insulator 150 may have a bending member shown in FIG. 2a and FIG. 2b which reflects a radiant heat from the melt M in the crucible 110 into an inside wall of the crucible 110.

The bending member of the top insulator 150 may be a bending portion of the top insulator 150, which is bent in a direction toward an inner side of the crucible or toward the crucible 110.

The top insulator 150 may be comprised of a crucible screen 152, a first insulator 154, and a second insulator 156.

The crucible screen 152 may be disposed on an upper end of the crucible 110, and supported by the upper end of the crucible 110.

The crucible screen 152 may be a single layer formed of molybdenum or tungsten that exhibits excellent thermal insulation. A thickness of the crucible screen 152 may be in a range of 5 mm to 10 mm.

The crucible screen 152 may have a bending member reflecting radiant heat generated from the melt M accommodated in the crucible 110 into the crucible 110.

The first insulator 154 may be disposed on the crucible screen 152, and in turn the second insulator 156 may be disposed on the first insulator 154.

Each of the first and second insulators 154 and 156 may be a stack of a plurality of layers, and an air gap may be present between the respective neighboring layers to provide insulation.

For example, each of the first and second insulators 154 and 156 may include a first layer as a lowermost layer, and a plurality of second layers sequentially stacked over the first layer. The first layer may be formed of tungsten, and the second layers may be formed of molybdenum. To enhance thermal insulation, the number of the second layers included in the second insulator 156 may be greater than the number of the second layers included in the first insulator 154. The first and second insulators 154 and 156 may be supported by an upper end of the heater 130, but is not limited thereto. Each of the crucible screen 152, the first insulator 154 and the second insulator 156 may have the opening 190 which is aligned or corresponding to the growing single crystal I. The growing single crystal I may be move in or out through the opening 190, but is not limited thereto.

FIG. 2a shows a floor plan of the crucible shown in FIG. 1, and FIG. 2b shows a cross section in AB direction of the crucible shown in FIG. 2a.

Referring to FIG. 2a and FIG. 2b, the crucible screen 152 may have a bending member reflecting radiant heat generated from the melt M accommodated in the crucible 110 into the crucible 110.

The bending member may be a bending portion of the crucible screen 152, which is bent in a direction toward the crucible 110.

The crucible screen 152 may be round plate type and have an opening 190-1 as a central opening, and include an outer side part 218 which is a region within a first distance a1 from an outer circumference surface 208 and an inner side part 219 which is a region within a second distance a2 from an inner peripheral surface 207.

An end of the inner side part 219 positioned between the outer circumference surface 208 and the inner peripheral surface 207 may be in contact with an end of the outer side part 218 positioned between the outer circumference surface 208 and the inner peripheral surface 207.

The end of the outer side part 218 may be supported by the upper end of the crucible 110.

The inner side part 219 of the crucible screen 152 may have the bending member which is bent in the direction toward the crucible 110 and inclined with a predetermined angle with respect to the outer side part 218.

A lower surface 412 of the inner side part 219 may be inclined toward the crucible with a predetermined angle with respect to a lower surface 411 of the outer side part 218. Moreover, an upper surface 422 of the inner side part 219 may be inclined with a predetermined angle θ with respect to an upper surface 421 of the outer side part 218. For example, in FIG. 2b, the total inner side part 219 may be a bending member. The inner side part 219 may have the same thickness with the outer side part 218.

A rate between a width a1 of the outer side part 218 and a width a2 of the inner side part 219 may be 1:2. The predetermined angle θ may be 5°~10°.

During the growing process of the single crystal, the side sticking may be generated based on a rate of transverse growth and a lowering speed of a surface of melt M.

The side sticking means the growing single crystal sticks to poly-crystal material, which is formed on a sidewall of the crucible according to the temperature change of the crucible when the single crystal is growing transversely. The poly-crystal material Remaining melt in the crucible or a material evaporated from the melt may be solidified at the sidewall of the crucible which grows cool. When the rate of transverse growth of the single crystal is high and the lowering speed of a surface of melt is slow, the side sticking may be induced.

In case that the heat supplied from the heater to the crucible is out of balance or the alignment between the seed and convection current point of the melt, the side sticking may be generated. If the side sticking is generated, the single crystal with a good quality may not be obtained, and the single crystal may be damaged or a crack may be generated when the single crystal is lifted off from the crucible.

Figure 3:
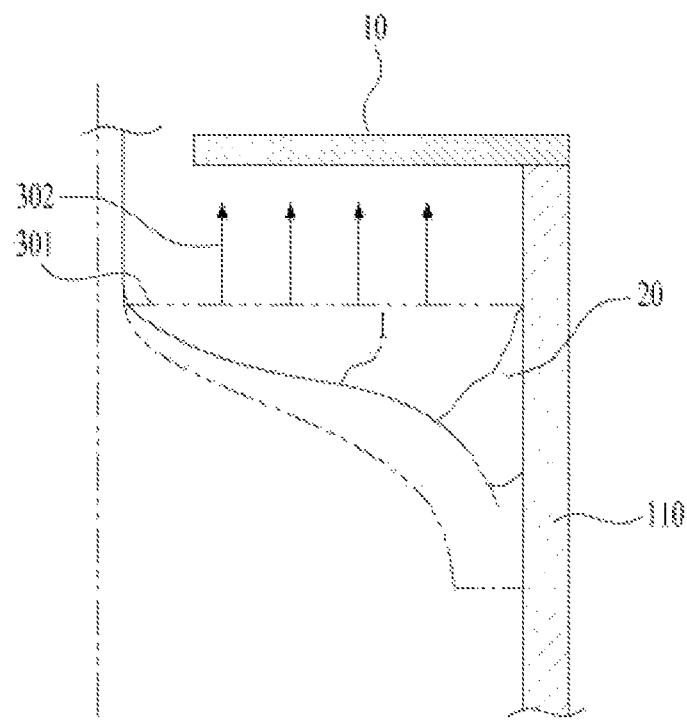
FIG. 3 shows a conventional crucible structure.

FIG. 3 shows a conventional crucible structure. Referring to FIG. 3, the crucible screen positioned on the upper end of the crucible 110 conventionally has a structure parallel to a surface 301 of the melt M. Due the structure parallel to the surface 301 of the melt M, the radiant heat 302 emitted from the surface 301 of the melt M may be reflected to the melt M and the crucible screen 10 may just play a role as the insulation. The side sticking may not be prevented in the structure of the crucible screen 10 in FIG. 3.

Figure 4:
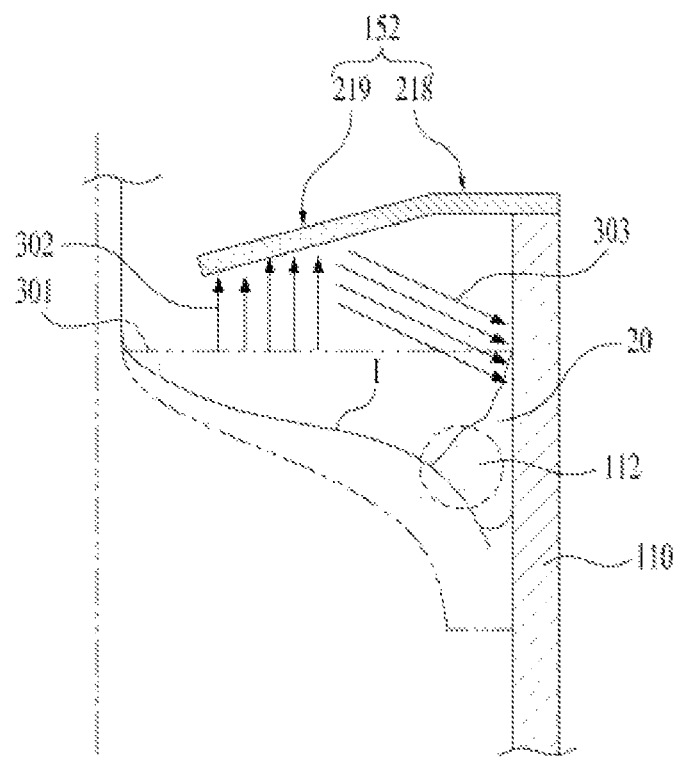
FIG. 4 shows concepts to prevent side sticking due to a crucible screen structure.

FIG. 4 shows concepts to prevent side sticking due to a crucible screen structure. Referring to FIG. 4, the radiant heat 302 emitted from the surface 301 of the melt M may be reflected to the sidewall of the crucible and therefore a temperature of an inside of the crucible 110 may rise because the crucible screen 152 according to an embodiment has the inner side part 219 which is bent with a predetermined angle θ.

If the temperature of an inside of the crucible 110 rises, it is prevented that remaining melt in the crucible or a material evaporated from the melt M is solidified and poly crystal 20 is formed at the sidewall of the crucible 110. Therefore according to the embodiment, it is prevented that poly crystal 20 is formed at the sidewall of the crucible 110 and the side sticking is generated because it is prevented that the temperature of the crucible 110 goes down as the surface 301 of the melt M is lowering.

A portion 112 of the inside wall of the crucible 110 which the radiant heat 303 reaches depends on a bent angle θ of the inner side part 219. Therefore by controlling the bent angle θ, the radiant heat 303 reflected by the inner side part 219 can be transferred to the portion 112 of the inside wall of the crucible, which exposed from the melt M as the melt M is decreased. And the transferred radiant heat 303 may prevent the side sticking from generating.

In the embodiment shown in FIG. 1, the outer side part 218 of the crucible screen 152 is directly supported by the upper end of the crucible 110, but in another embodiment, the spacer may be disposed between the upper end of the crucible 110 and the outer side part 218 of the crucible screen 152.

Figure 5:
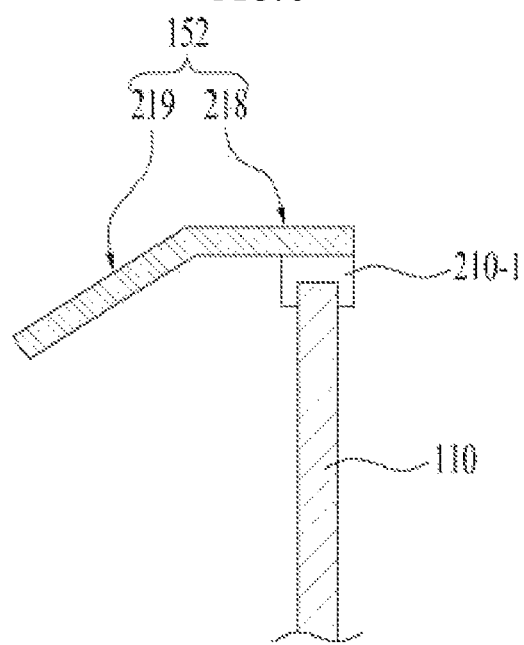
FIG. 5 shows a spacer included in the single-crystal growth apparatus according to an embodiment.
Figure 6:
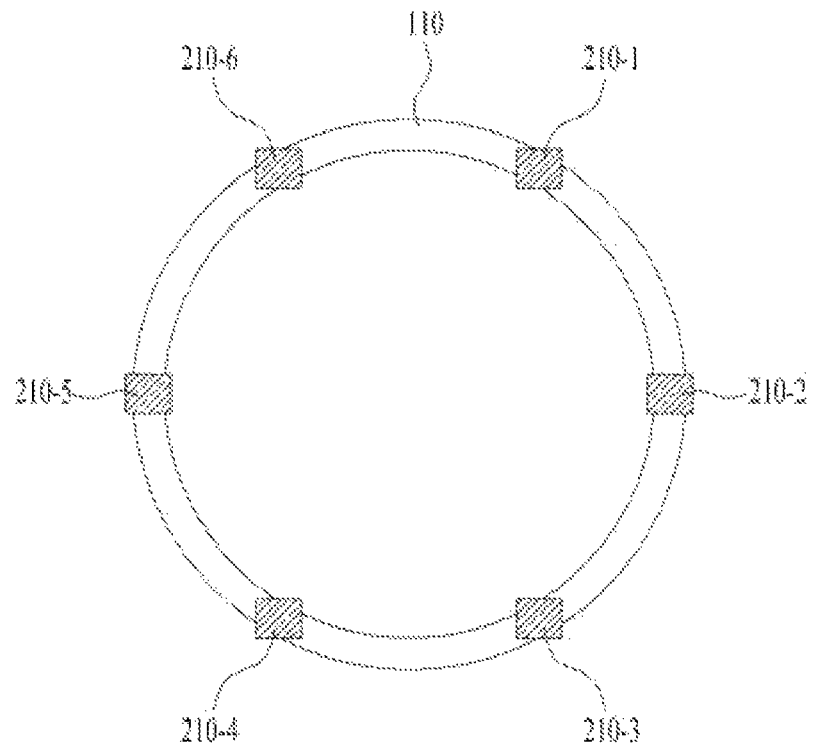
FIG. 6 shows an arrangement of the spacer shown in FIG. 5.

FIG. 5 shows a spacer 210-1 included in the single-crystal growth apparatus according to an embodiment, and FIG. 6 shows an arrangement of the spacer shown in FIG. 5.

Referring to FIG. 5 and FIG. 6, a plurality of spacers 210-1 to 210-n, n is natural number and n>1 are disposed between the upper end of the crucible 110 and the outer side part 218 of the crucible screen 152. The plurality of spacers 210-1 to 210-n may be spaced away from each other. A space is formed between the spacers 210-1 to 210-n. A gas of the inside of the crucible 110 may get out through the space. The plurality of spacers 210-1 to 210-n may be formed of molybdenum.

Figure 7:
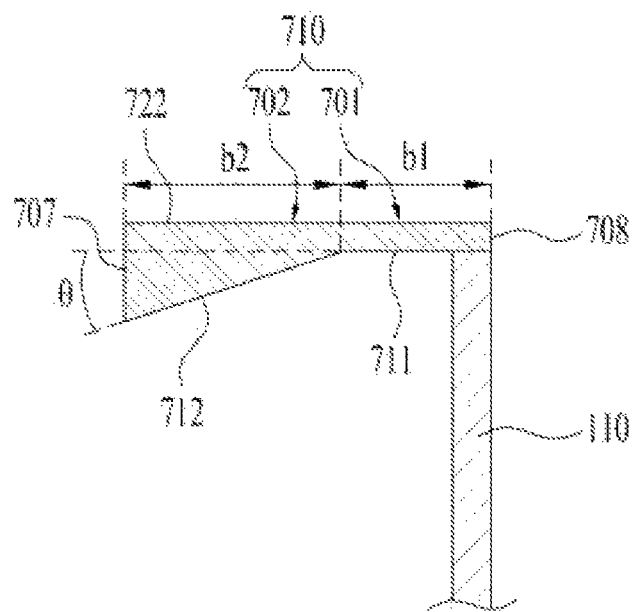
FIG. 7 shows a cross section of a first top insulator according to another embodiment

FIG. 7 shows a cross section of a first top insulator according to another embodiment. Referring to FIG. 7, the crucible screen 710 may include an outer side part 701 and an inner side part 702.

The crucible screen 710 may be round plate type.

The outer side part 701 of the crucible screen 710 may be a region within a third distance b1 from an outer circumference surface 708. The inner side part 702 of the crucible screen 710 may be a region within a fourth distance b2 from an inner peripheral surface 707.

An end of the inner side part 702 positioned between the outer circumference surface 708 and the inner peripheral surface 707 may be in contact with an end of the outer side part 701 positioned between the outer circumference surface 708 and the inner peripheral surface 707. The third distance b1 may be the same with the first distance a1 and the fourth distance b2 may be the same with the second distance a2.

The inner side part 702 of the crucible screen 710 may be bent in a direction toward the crucible 110 with a predetermined angle θ with respect to the outer side part 701.

A lower surface 712 of the inner side part 702 may be sloped with a predetermined angle with respect to a lower surface 711 of the outer side part 701.

An upper surface 721 of the outer side part 701 and an upper surface 722 of the inner side part 702 may be parallel to each other and be on the same level or the same plane.

The lower surface 712 of the inner side part 702 shown in FIG. 7 is only bent and the upper surface 722 of the inner side part 702 is not bent. The thickness of the inner side part 702 may gradually decrease from the inner peripheral surface 707 toward the outer circumference surface 708.

The radiant heat emitted from the melt may be reflected to the side wall of the crucible 110 and therefore the side sticking can be prevented because the lower surface 712 of the inner side part 702 has a sloped structure.

Figure 8:
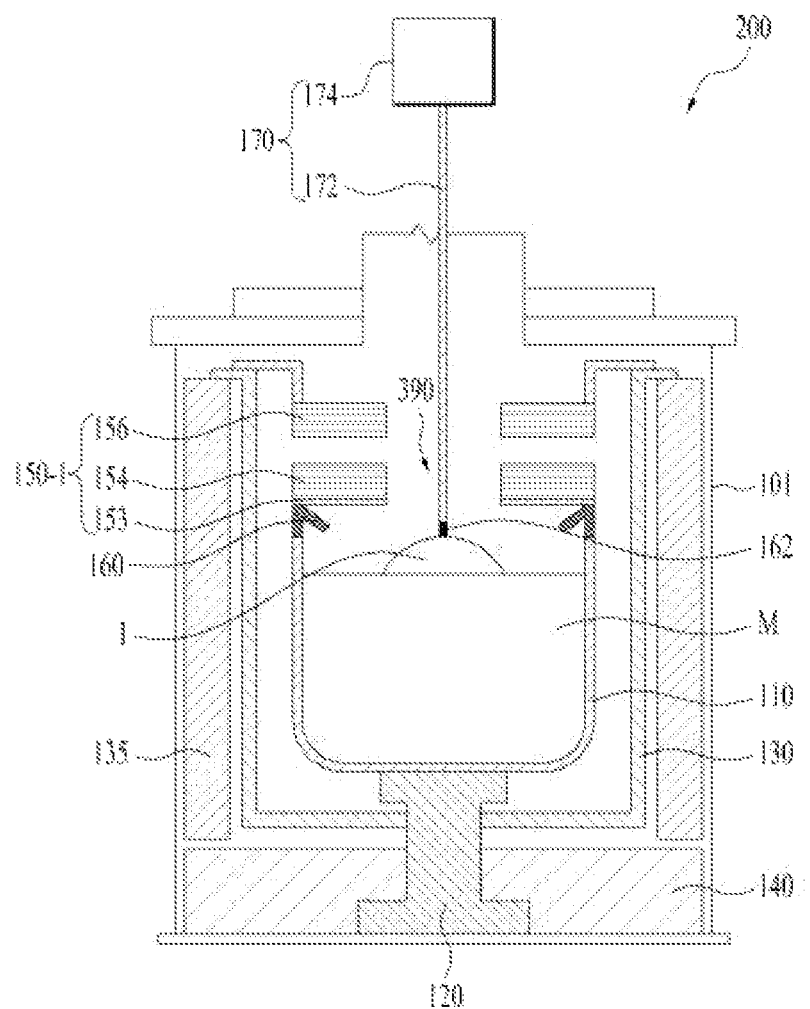
FIG. 8 shows a single-crystal growth apparatus according to an another embodiment.

FIG. 8 shows a single-crystal growth apparatus 200 according to another embodiment. The numeral which is the same with that of FIG. 1 represents the same element, and the explanation about the same element is simplified or omitted.

Referring to FIG. 8, the single-crystal growth apparatus 200 includes a chamber 101, a crucible 110, a crucible support base 120, a heater 130, a sidewall insulator 135, a bottom insulator 140, a top insulator 150-1, a reflecting member 160 and the transfer unit 170.

The top insulator 150-1 may be located on the crucible 110, to prevent heat from escaping through the top of the crucible 110.

The top insulator 150-1 may be comprised of a crucible screen 153, a first insulator 154, and a second insulator 156.

The crucible screen 152 shown in FIG. 1 has the bending member, but the crucible screen 153 shown in FIG. 8 has a flat ring shape.

The reflecting member 160 is disposed between the upper end of the crucible 110 and the crucible screen 153, and reflects the radiant heat emitted from the melt M accommodated in the crucible 110 to the sidewall of the crucible 110.

For example, the reflecting member 160 may contact the upper end of the crucible 110 and be supported by the upper end of the crucible 110. The top insulator 150-1 may be located on the reflecting member 160.

Each of the reflecting member 160 and the top insulator 150 may have a central opening 390, which is aligned or corresponding to the growing single crystal I.

The crucible screen 153 may be disposed on the reflecting member 160, and reflect the radiant heat emitted from a surface of the melt M to the melt M. The crucible screen 153 may be supported by the reflecting member 160.

The crucible screen 153 may be a single layer formed of molybdenum or tungsten that exhibits excellent thermal insulation. For example, a thickness of the crucible screen 153 may be in a range of 5 mm to 10 mm, but is not limited thereto.

The first insulator 154 may be disposed on the crucible screen 153, and the second insulator 156 may be disposed on the first insulator 154.

Each of the crucible screen 153, the first insulator 154, and the second insulator 156 may have an central opening 390, which is aligned or corresponding to the growing single crystal I.

The reflecting member 160 may have a bending member reflecting a radiant heat generated from the melt M in the crucible 110 into an inside wall of the crucible 110. The bending member of the reflecting member 160 may be a bending portion which is bent in a direction toward an inner side of the crucible or toward the crucible 110.

Figure 9:
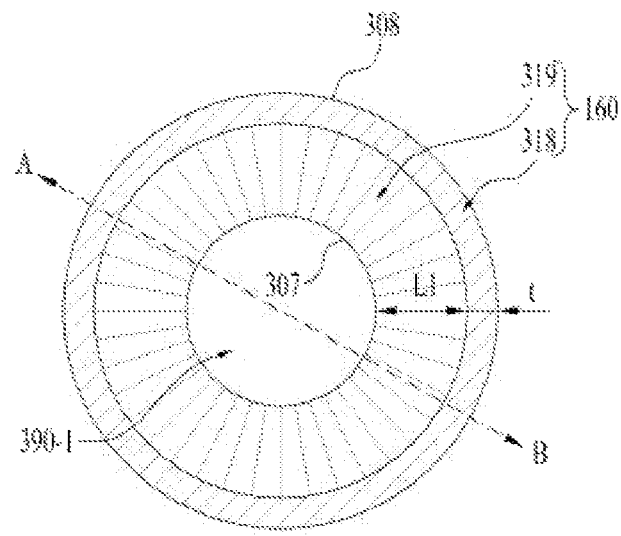
FIG. 9 shows a floor plan of the reflecting member shown in FIG. 8.
Figure 10:
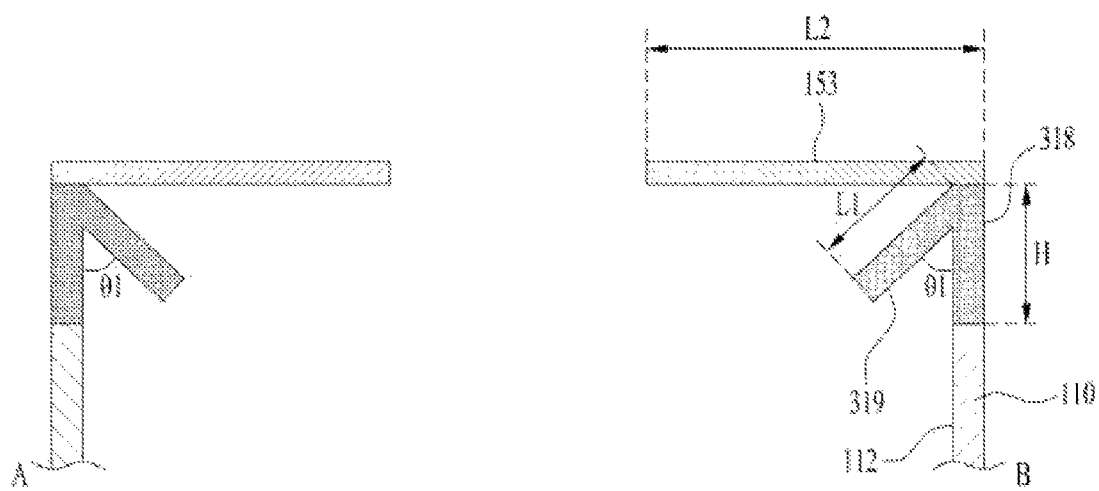
FIG. 10 shows a cross section in AB direction of the reflecting member shown in FIG. 9.

FIG. 9 shows a floor plan of the reflecting member shown in FIG. 8, and FIG. 10 shows a cross section in AB direction of the reflecting member shown in FIG. 9.

Referring to FIG. 9 and FIG. 10, the reflecting member 160 may have a round plate shape having a central opening 390-1, for example, a ring shape. The reflecting member 160 may contact an edge of the lower surface of the crucible screen 153. The reflecting member 160 may include a supporting part 318 supporting the crucible screen 153 and a bending part 319 which is bent from the supporting part 318 and reflecting the radiant heat generated from the melt M in the crucible 110 to the inside wall 112 of the crucible.

One end of the supporting part 318 may contact the edge of the lower surface of the crucible screen 153 and the other end of the supporting part 318 may contact the upper end of the crucible 110.

A height H of the supporting part 318 is 25 mm~35 mm, but is not limited thereto. A thickness of the supporting part 318 may be the same with that of the bending part 319, but is not limited thereto.

The bending part 319 may have a round plate shape having a central opening 390-1, for example, a ring shape.

A length L1 of the bending part 319 is shorter than a radius length L2 of the crucible screen 153. L2 may mean a radius length of the crucible screen except the opening 390-1.

The bending part 319 may be sloped with a predetermined angle θ1 with respect to the supporting part 318. The angle θ1 between the bending part 319 and the supporting part 318 may be 30°~45°.

The length L1 of the bending part 319 is smaller than or equal to a value which is the height H of the supporting part 318 divided by cos θ1(L1≤H/cos θ1). θ1 may be an angle between the bending part 319 and the supporting part 318.

In case that the length L1 of the bending part 319 is greater than H/cos θ1, the lift off process which separate the grown single crystal from the crucible 110 may be impracticable because the distance for pulling the growing single crystal decreases.

The reflecting member 160 may be formed of any material that exhibits excellent thermal conductivity and heat-resistance as well as high resistance to thermal shock and low thermal expansion rate. For example, the reflecting member 160 may be formed of molybdenum, but is not limited thereto.

During the growing process of the single crystal, the side sticking may be generated based on a rate of transverse growth and a lowering speed of a surface of melt M. For example, when the rate of transverse growth of the single crystal is high and the lowering speed of a surface of melt is slow, the side sticking may be induced. Moreover, when the heat supplied from the heater to the crucible is out of balance or the alignment between the seed and convection current point of the melt, the side sticking may be generated.

Because of the side sticking, the crack in the growing single crystal may be generated so that the single crystal with a good quality is not obtained and the yield of the single crystal decreases, and the growing time for removing the side sticking may be increased.

Figure 11:
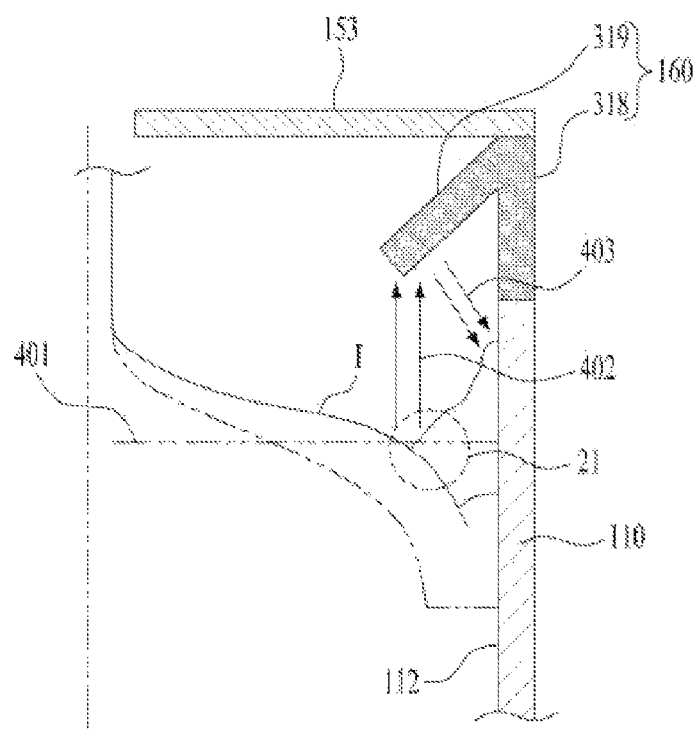
FIG. 11 shows concepts to prevent side sticking due the reflecting member shown in FIG. 8.

FIG. 11 shows concepts to prevent side sticking due to the reflecting member 160 shown in FIG. 8.

Referring to FIG. 11, the radiant heat 402 emitted from a surface 401 of the melt may be reflected to the inside wall 112 of the crucible 110 by the bending part 319 of the reflecting member 160.

The heat 403 reflected to the inside wall 112 of the crucible 110 by the bending part 319 may increase the temperature of the inside wall 112 of the crucible 110 or the temperature of the inside of the crucible 110.

When the temperature of the inside wall 112 of the crucible 110 or the temperature of the inside of the crucible 110 increases, it is prevented that the poly crystal 21 is formed at the inside wall 112 of the crucible 110. Therefore it is prevented that the poly crystal 21 is formed at the inside wall 112 of the crucible 110 and the side sticking is generated because the radiant heat 403 reflected by the reflecting member 160 prevents the temperature of the crucible 110 from decreasing as the surface of the melt goes down.

A range of the inside wall 112 of the crucible which the radiant heat 403 can reach may depend on the length L1 of the bending part 319, and bent angle θ1.

The radiant heat 302 emitted from the surface 301 of the melt M and the heat 303 reflected to the inside wall 112 of the crucible 110 may go out through the space between the spacers 210-1 to 210-6 shown in FIG. 5, and therefore abnormal growth of the single crystal may be generated or the effect of preventing side sticking may be decreased.

The reflecting member 160 can prevent the radiant heat 402 and the heat 403 from going out through the space between the crucible screen 153 and the upper end of the crucible 110, because the reflecting member 160 shown in FIG. 11 seals the space between the crucible screen 153 and the upper end of the crucible 110. The side sticking can be more effectively prevented in the embodiment in FIG. 11, compared with the embodiment in FIG. 1.

Figure 12:
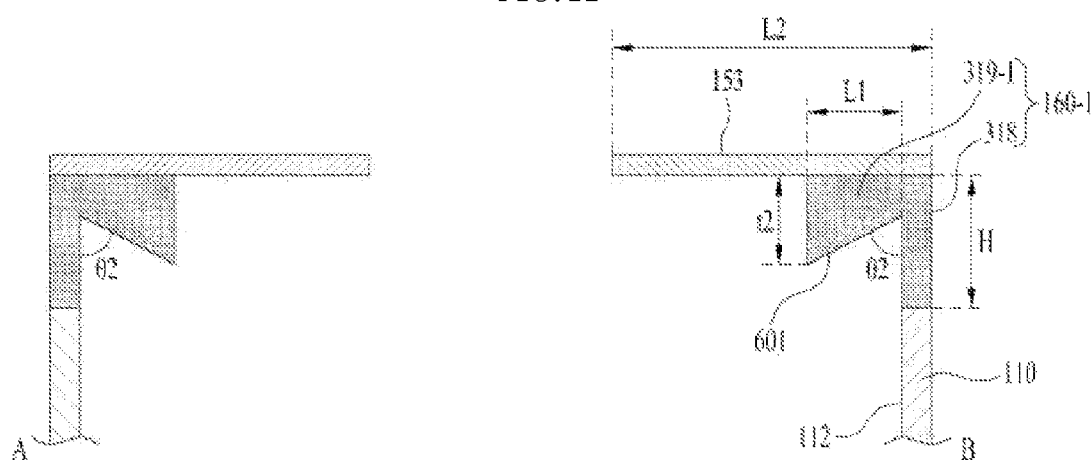
FIG. 12 shows an another embodiment of the reflecting member.

FIG. 12 shows another embodiment of the reflecting member. The numeral which is the same with that of FIG. 10 represents the same element, and the explanation about the same element is simplified or omitted.

Referring to FIG. 12, the reflecting member 160-1 includes the supporting part 318 and a bending part 319-1. A thickness t2 of the bending part 319-1 shown in FIG. 12 gradually increases from the outer circumferential surface to the inner peripheral surface. For example, the thickness t2 of the bending part 319-1 may increase from a boundary surface between the bending part 319-1 and the supporting part 318 toward an end of the bending part 319-1. An upper surface of the bending part 319-1 may be flat and contact a lower surface of the crucible screen 153. The bending part 319-1 can support the crucible screen 153 stably because the upper surface of the bending part 319-1 contacts the lower surface of the crucible screen 153.

The lower surface 601 of the bending part 319-1 may be sloped with respect to the upper surface of the bending part 319-1, and an angle θ2 between the lower surface 601 of the bending part 319-1 and the supporting part 318 may be 10°~40°.

The side sticking can be prevented because the radiant heat emitted from the melt M is reflected to the inside wall 112 of the crucible 110 or inside edge of the crucible 110 by the lower surface 601 of the bending part 319-1.

The above-described features, configurations, effects, and the like of the embodiments are included in at least one embodiment of the disclosure, and are not intended to be limited to any one embodiment. Moreover, the features, configurations, effects, and the like illustrated in the respective embodiments can be combined or modified in various ways by those skilled in the art that will fall within the spirit and scope of the principles of this disclosure. Accordingly, content related to these combinations and modifications must be construed as being within the scope of the disclosure.

INDUSTRIAL APPLICABILITY

A single-crystal growth apparatus according to the embodiments may be utilized in a single-crystal growth process.

The invention claimed is:
1. A single-crystal growth apparatus comprising:
a chamber;
a crucible provided in the chamber and configured to accommodate a melt that is a raw material for single-crystal growth;
a heater disposed between the crucible and a side wall of the chamber, and the heater to heat the crucible; and
a crucible screen disposed on an upper end of the crucible, wherein the crucible screen includes:
an outer side part disposed adjacent to an outer circumference surface, wherein the outer side part contacts the upper end of the crucible and is supported by the upper end of the crucible, and
an inner side part disposed adjacent to an inner peripheral surface and having a bending member for reflecting a radiant heat generated from the melt in the crucible to an inside wall of the crucible, and
wherein a lower surface of the inner side part is inclined toward the crucible with respect to a lower surface of the outer side part, and a thickness of the inner side part decreases from the inner peripheral surface toward the outer circumference surface.

2. The apparatus according to claim 1, wherein the bending member is a bending portion of the crucible screen which is bent in a direction toward the crucible.

3. The apparatus according to claim 1, wherein the crucible screen is round plate type and has a central opening.

4. The apparatus according to claim 3, wherein the inner side part is bent in a direction toward the crucible with respect to the outer side part.

5. The apparatus according to claim 1, wherein an upper surface of the outer side part and an upper surface of the inner side part are parallel to each other and are on the same plane.

6. The apparatus according to claim 1, further comprising at least one top insulator disposed on the crucible screen, and wherein the at least one top insulator is a stack of a plurality of layers.

7. A single-crystal growth apparatus comprising:
a chamber;
a crucible provided in the chamber and configured to accommodate a melt that is a raw material for single-crystal growth;
a reflecting member disposed on an upper end of the crucible and reflecting a radiant heat generated from the melt in the crucible to an inside wall of the crucible; and
a crucible screen disposed on the reflecting member, and the crucible screen to reflect a radiant heat emitted from a surface of the melt into the melt,
wherein the reflecting member includes:
a supporting part to support the crucible screen, and
a bending part bent from the supporting part, and the bending part to reflect the radiant heat generated from the melt into the inside wall of the crucible, wherein a first end of the supporting part contacts an edge of a lower surface of the crucible screen, and a second end of the supporting part contacts the upper end of the crucible, wherein an upper surface of the bending part contacts the lower surface of the crucible screen, and a lower surface of the bending part is sloped with respect to the upper surface of the bending part, and wherein a thickness of the bending part increases from a boundary surface between the bending part and the supporting apart toward an end of the bending part.

8. The apparatus according to claim 7, wherein the reflecting member is round plate type and has a central opening.

9. The apparatus according to claim 7, wherein a length of the bending part is shorter than a radius length of the crucible screen.

10. The apparatus according to claim 7, wherein the length of the bending part is smaller than or equal to the height of the supporting part divided by cos θ1, and θ1 is an angle between the bending part and the supporting part.

11. The apparatus according to claim 7, wherein the reflecting member is formed of a molybdenum.

12. The apparatus according to claim 1, further comprising at least one top insulator disposed on the crucible screen, and wherein the at least one top insulator is a stack of a plurality of layers.

13. The apparatus according to claim 1, wherein a ratio between a width of the outer side part and a width of the inner side part is 1:2.

14. The apparatus according to claim 1, wherein the lower surface of the inner side part is inclined toward the crucible with a predetermined angle with respect to the lower surface of the outer side part, and wherein the predetermined angle is 5°~10°.

15. The apparatus according to claim 7, wherein an angle between the bending part and the supporting part is 30°~45°.

16. The apparatus according to claim 7, wherein the bending part has a round plate shape having a central opening.

\* \* \* \* \*